US012675616B2

(12) United States Patent
Forshaw

(10) Patent No.: US 12,675,616 B2
(45) Date of Patent: Jul. 7, 2026

(54) 3D MULTI-OBJECT SIMULATION

(71) Applicant: Five AI Limited, Bristol (GB)

(72) Inventor: Jon Forshaw, Berkhamsted (GB)

(73) Assignee: Five AI Limited, Cambridge (GB)

( * ) Notice: Subject to any disclaimer, the term of this patent is extended or adjusted under 35 U.S.C. 154(b) by 873 days.

(21) Appl. No.: 18/010,953

(22) PCT Filed: Jul. 23, 2021

(86) PCT No.: PCT/EP2021/070668

§ 371 (c)(1),
(2) Date: Dec. 16, 2022

(87) PCT Pub. No.: WO2022/023199

PCT Pub. Date: Feb. 3, 2022

(65) Prior Publication Data

US 2023/0237210 A1 Jul. 27, 2023

(30) Foreign Application Priority Data

Jul. 27, 2020 (GB) ..................................... 2011595

(51) Int. Cl.
*G06F 30/15* (2020.01)
*G06F 11/3698* (2025.01)
(Continued)

(52) U.S. Cl.
CPC .......... *G06F 30/15* (2020.01); *G06F 11/3698* (2025.01); *G06T 15/06* (2013.01);
(Continued)

(58) Field of Classification Search
CPC .. G06F 30/15; G06F 11/3698; G06F 11/3668; G06F 30/20; G06T 15/06;
(Continued)

(56) References Cited

U.S. PATENT DOCUMENTS 11,928,399 B1 * 3/2024 Dolan ..................... G06F 30/15
2022/0012466 A1 * 1/2022 Taghavi .............. G06F 18/2163

OTHER PUBLICATIONS

Jung, Sunghoon, and Minhwan Kim. "Estimation of a 3D bounding box for a segmented object region in a single image." IEICE Transactions on Information and Systems 97.11 (2014): 2919-2934. (Year: 2014).*

(Continued)

*Primary Examiner* — Chuen-Meei Gan
(74) *Attorney, Agent, or Firm* — Andrew J. Tibbetts; Samuel S. Stone; Greenberg Traurig, LLP

(57) ABSTRACT

An occlusion metric is computed for a target object in a 3D multi-object simulation. The target object is represented in 3D space by a collision surface and a 3D bounding box. In a reference surface defined in 3D space, a bounding box projection is determined for the target object with respect to an ego location. The bounding box projection is used to determine a set of reference points in 3D space. For each reference point of the set of reference points, a corresponding ray is cast based on the ego location, and it is determined whether the ray is an object ray that intersects the collision surface of the target object. For each such object ray, it is determined whether the object ray is occluded. The occlusion metric conveys an extent to which the object rays are occluded.

20 Claims, 12 Drawing Sheets

602

600

112

(51) Int. Cl.
      *G06T 15/06*        (2011.01)
      *G06T 15/20*        (2011.01)
(52) U.S. Cl.
      CPC ........... *G06T 15/20* (2013.01); *G06T 2210/12*
                      (2013.01); *G06T 2210/21* (2013.01)
(58) Field of Classification Search
      CPC . G06T 15/20; G06T 2210/12; G06T 2210/21;
                      G06V 10/25; G06V 10/26; G06V 20/58
      See application file for complete search history.

(56)                    References Cited

OTHER PUBLICATIONS

International Search Report, PCT/EP2021/070668, Date: Oct. 26, 2021, By: Authorized Officer: Salsa, Francesco.
Gu Tianyu et al, "A Lightweight Simulator for Autonomous Driving Motion Planning Development", Jan. 1, 2015 (Jan. 1, 2015), p. 1-4, Retrieved from the Internet: URL:https://www.ri.cmu.edu/pub_files/2015/10/Intelli-2015-Final.pdf.
Maxime Bouton et al, "Safe Reinforcement Learning with Scene Decomposition for Navigating Complex Urban Environments", arxiv.org, Cornell University Library, 201 Olin Library Cornell University Ithaca, NY 14853,Apr. 25, 2019 (Apr. 25, 2019).

* cited by examiner

Project 3D bounding box
into reference plane 109

Transform reference
plane 109 into 2D space

Generate grid in 2D space

3D MULTI-OBJECT SIMULATION

CROSS-REFERENCE TO RELATED APPLICATIONS

This application is the U.S. National Stage application, pursuant to 35 U.S.C. § 371, of PCT International Patent Application No. PCT/EP2021/070668, filed Jul. 23, 2021, designating the United States and published in English, which claims priority under 35 U.S.C. §§ 119 and 365 to Great Britain Patent Application No. 2011595.2, filed Jul. 27, 2020. The contents of each of the aforementioned applications are incorporated herein by reference in their entirety.

TECHNICAL FIELD

The present disclosure relates to 3D multi-object simulation, where the aim is to simulate the perception of multiple objects by a sensor system at a particular location in 3D space (the ego location). Example applications of the present technology include autonomous vehicle (AV) testing using simulated perception inputs.

BACKGROUND

There have been major and rapid developments in the field of autonomous vehicles. An autonomous vehicle is a vehicle which is equipped with sensors and control systems which enable it to operate without a human controlling its behaviour. An autonomous vehicle is equipped with sensors which enable it to perceive its physical environment, such sensors including for example cameras, radar and lidar. Autonomous vehicles are equipped with suitably programmed computers which are capable of processing data received from the sensors and making safe and predictable decisions based on the context which has been perceived by the sensors. There are different facets to testing the behaviour of the sensors and control systems aboard a particular autonomous vehicle, or a type of autonomous vehicle.

Sensor processing may be evaluated in real-world physical facilities. Similarly, the control systems for autonomous vehicles may be tested in the physical world, for example by repeatedly driving known test routes, or by driving routes with a human on-board to manage unpredictable or unknown contexts.

Physical world testing will remain an important factor in the testing of autonomous vehicles capability to make safe and predictable decisions. However, physical world testing is expensive and time-consuming. Increasingly there is more reliance placed on testing using simulated environments. Autonomous vehicles need to have the facility to operate in the same wide variety of circumstances that a human driver can operate in. Such circumstances can incorporate a high level of unpredictability.

It is not viable to achieve from physical testing a test of the behaviour of an autonomous vehicle in all possible scenarios that it may encounter in its driving life. Increasing attention is being placed on the creation of simulation environments which can provide such testing in a manner that gives confidence that the test outcomes represent potential real behaviour of an autonomous vehicle.

For effective testing in a simulation environment, the autonomous vehicle under test (the ego vehicle) has knowledge of its location at any instant of time, understands its context (based on simulated perception input) and can make safe and predictable decisions about how to navigate its environment to reach a pre-programmed destination.

Simulation environments need to be able to represent real-world factors that may change in the road layout in which it is navigating. This can include weather conditions, road types, road structures, junction types etc. Another key factor is the ability to simulate moving actors (such as other vehicles, pedestrians, bicycles, animals etc). This list is not exhaustive, as there are many factors that may affect the operation of an ego vehicle. A complex AV stack can be highly sensitive to small changes in road layout, environmental conditions, or a particular combination of factors might result in failure in a way that is very hard to predict. If simulation results are to be relied on, a very large number of simulations will be required in order to verify that a stack is performing to a required level of safety or performance.

A full AV stack includes a perception system that receives sensor inputs, typically from multiple sensors, and processes those inputs to provide more targeted measurements to higher level components, such as planning or prediction. There are many types of perception model that can be applied in this context, such as 2D or 3D object detectors, segmentation models, models for estimating the location, orientation and/or size of other objects (such as 2D or 3D bounding box detectors), image classifiers or fusion components that can fuse measurements from multiple sensors or sensor modalities (e.g. stereo image, Radar, Lidar etc.), to name but a few. In general, a perception system or component takes lower-level perception inputs (such as raw sensor data) and interprets those inputs to provide higher-level perception outputs to other component(s) of the perception system and/or other component(s) of the stack (prediction, planning etc.).

A simulator is a computer program which when executed by a suitable computer enables all or part of an AV stack to be developed and tested in simulation, before its deployment on a physical vehicle. One approach to simulation provides a sensor simulation system which models each type of sensor with which the autonomous vehicle may be equipped. Here, the aim is to provide simulated sensor data that is realistic enough for a perception system to respond to in the same way as it would respond to real sensor data captures in equivalent circumstances. This may be referred to herein as "photorealistic simulation" but that terminology encompasses not only simulated image data but also other simulated sensor modalities such as Radar or Lidar.

SUMMARY

One issue with photorealistic simulation is that certain perception components, such as Convolutional Neural Networks (CNNs), are particularly sensitive to the quality of the simulated data. Although it is possible to generate high quality simulated image data, the CNNs in perception are extremely sensitive to even the minutest deviations from real data. Therefore, these would require exceptionally high-quality simulated image data covering all possible conditions that an AV might encounter in the real-world (e.g. different combinations of simulated weather conditions, lighting conditions etc.)—otherwise their behaviour in a simulated scenario will not adequately reflect their behaviour in the real-world.

A second issue problem is that certain types of sensor data are particularly hard to model (simulate). Thus, even a perception system that is not particularly sensitive to the quality of the input data will give poor results, e.g. RADAR falls into the category of sensor data that is extremely difficult to simulate. This is because the physics of RADAR is inherently hard to model.

The above issues limit the usefulness of photorealistic simulation for AV testing. Moreover, even in circumstances where photorealistic simulation is useful, generating simulated sensor data of sufficient quality is very expensive (in terms of computing resources). For example, generating realistic simulated image data requires state of the art 3D rendering of highly detailed 3D models, typically requiring 30 renderings or more per second (to simulate data from a camera system operating at 30 fps or more).

An alternative form of simulation may be referred to herein as "headless simulation". In headless simulation, the aim is to "bypass" all or part of the perception system, and apply only the remaining "slice" of the AV stack during testing. Instead of generating simulated sensor data that can be provided to the lowest levels of the perception system, headless simulation simulates higher-level perception inputs directly. For example, rather than simulating photorealistic image data that is then provided to bounding box detector, headless simulation might simply provide simulated bounding box detection outputs directly, given an ego location and a location of a target object that are known within the simulation. In these circumstances, the bounding box detector is not actually applied during the simulation-based testing, but the simulated perception outputs are used to drive higher-level components of the stack. As will be appreciated, many forms of perception output can be simulated in this way in a manner that is far more efficient than photorealistic simulation.

A simulated perception output generated in this manner may be considered a form of "ground truth". This is because it is a "perfect" perception output that is free from the kind of error that would normally be introduced by the perception component(s) that have been bypassed. Higher level components (planning, prediction etc.) can be applied to ground truth perception output and that provides useful testing to a degree. However, no perception system will ever be error free, and it is vital that an AV stack is able to perform effectively in the presence of perception error. Headless simulation with ground truth perception outputs alone cannot test the performance of a stack in the presence of perception error.

Perception error can, however, be accommodated in headless simulation using suitable perception error models. A perception error model allows ground truth perception outputs to be transformed into more realistic perception outputs with artificially-introduced errors that mirror the kind of perception error that would be introduced in the real-world. That way, the performance of the remaining slice of the AV stack in the presence of realistic perception error can be tested but still without any requirement for photorealistic simulation.

The level of perception error may, in reality, vary significantly in different circumstances. For example, weather, lighting, and physical properties of objects being perceived (speed, distance, texture, cloud etc.) are some factors that might influence perception error. Photorealistic simulation would attempt to simulate all of these factors in the simulated senor data, which would add to the complexity of the simulation. In headless simulation, these can be accommodated as variables of a perception error model(s) (referred to as "confounders" herein). By way of context, the following description considers perception error models that are trained on real data (referred to as "PRISMs" or "PSPMs") and can be used to sample perception errors for use in headless simulation that are statistically very similar to real-world perception errors, under different physical conditions represented by a set of confounders. An important factor in this context is occlusion. When perceiving a partially occluded object, the level of perception error has been found to vary significantly in dependence on the extent of occlusion. Herein, an object may be occluded because it is partially obscured by another within a sensor field of view (the view frustum), but also because it is currently located partially outside of the view frustum (the part of the object outside the frustum is said to be truncated herein). That is, the term occlusion covers not only occlusion by other objects but also truncation in this sense.

In headless simulation, it would therefore be desirable to provide some form of occlusion metric that could serve as a confounder in a perception error model. In that context, the perception error model would be used to introduce deliberate error into ground truth perception outputs derived in headless simulation, where the level of error pertaining to a particular simulated object (the target object) might vary in dependence on its extent of occlusion.

A naive approach to quantifying occlusion would be to simply render an image of all objects in a scene in an appropriate 2D local view space (corresponding to an ego position and sensor orientation), and determine the extent to which a target object is occluded in the rendered image. However, to be useful in the context of simulation context, it must be possible to compute an occlusion metric sufficiently cheaply (in terms of computing resources). In particular, if the resources required to compute the occlusion metric are comparable to rendering of the kind required in photorealistic simulation (as in the naive approach just mentioned), the efficiency benefits of headless simulation are all but lost.

There is provided herein a method of computing a useful occlusion metric for a target object within a 3D multi-object simulation. Beneficially, rendering is not required to compute the occlusion metric, and the method is significantly cheaper to implement than rendering. In a headless simulation context, the method can be applied to set an occlusion confounder (variable) of a perception error model for a target object. The simulator provides simulated ground truth perception output pertaining to the target object, into which the perception error model introduces errors at a level that reflect the extent of occlusion for the target object. The occlusion metric may be varied as the simulation progresses, and the level of perception error may therefore chance as the extent of occlusion changes.

A first aspect herein provides a computer-implemented method of computing an occlusion metric for a target object in a 3D multi-object simulation, the method comprising: determining, in a reference surface defined in 3D space, a bounding box projection for the target object of the 3D multi-object simulation, wherein the target object is represented in 3D space by a collision surface and a 3D bounding box, and the bounding box projection is determined by projecting the 3D bounding box into the reference surface with respect to an ego location; using the bounding box projection to determine a set of reference points in 3D space for raycasting within a region of 3D space defined by the ego location and the bounding box projection; for each reference point of the set of reference points, casting a corresponding ray within said region of 3D space based on the ego location, and determining whether the ray intersects the collision surface of the target object; for each ray that is determined to intersect the collision surface of the target object, determining whether the ray is occluded; and computing the occlusion metric, the occlusion metric conveying an extent to which the rays that intersect the collision surface of the target object are occluded.

This relies on two 3D structures to represent the object: a 3D bounding box, and a collision surface representing the object's surface. The collision surface is more detailed than the 3D bounding box, but does not necessarily need to include the level of detail that would be required for rendering.

For the purpose of estimating occlusion, the rays of interest are those that intersect the collision surface of the target object (referred to herein as object rays). The aim is to find a suitable (sub)set of object rays that can then be used to estimate occlusion. The bounding box projection is used to reduce the region of 3D space over which raycasting needs to be performed for that purpose. Projecting the 3D bounding box is a simpler (and less expensive operation) than would be required to project the collision surface or a more-detailed surface representation of the object.

In embodiments, the set of reference points may be determined in 3D space by determining a transformation of the reference surface into 2D space, in order to generate the set of reference points in 2D space within an object region defined by the bounding box projection, and transforming the reference points from 2D space into 3D space for raycasting.

The set of reference points may be a set of uniform grid points generated in 2D space within a rectangular object region that substantially encompasses the bounding box projection. This is a particularly efficient way of generating a suitable set of reference points and, with uniform grid points, the occlusion metric could, for example, be defined simply as the number of occluded (or non-occluded) object rays in proportion to the total number of object rays.

Once the subset of object rays has been found, each object ray is checked for occlusion.

In embodiments, for at least one of the rays determined to intersect the collision surface of the target object, determining whether the ray is occluded may comprise determining whether the ray intersects a collision surface of at least one other object of the 3D multi-body simulation between the ego location and the collision surface of the target object (occlusion by another object).

In such embodiments, in a first ray casting stage, each ray may be cast from the ego location against the collision surface of the target object only, to determine whether the ray collides with the collision surface of the target object. In a second ray casting stage, only ray(s) determined to intersect the collision surface of the target object in the first stage are re-cast, against the collision surface of the other object(s), to determine whether each of those ray(s) intersects the collision surface of the other object(s) between the ego location and the collision surface of the target object.

Each ray may be cast for the purpose of determining collision by incrementally extending the ray from the ego location and repeatedly checking whether the ray has collided with the collision surface(s) against which it has been cast (i.e. the collision surface of the target object only in the first stage, and the collision surface of the other object(s) in the second stage).

In the first stage, a maximum distance may be imposed on the first raycasting stage, the maximum distance defined by a point of the target object furthest from the ego location (such as a furthest corner of the 3D bounding box), wherein if any ray is extended up to the maximum distance without colliding with the collision surface of the target object, that ray is consequently determined not to intersect the collision surface of the target object.

In the second raycasting stage, the re-casting of each ray in the second raycasting stage may be limited using knowledge of the point at which the ray was determined to intersect the collision surface of the target object in the first raycasting stage, such that the ray is extended in the second raycasting stage no further than a collision distance defined by that known point.

In this case, it is not necessary to raycast against the collision surface of the target object in the second stage, i.e. it is not necessary to repeatedly check whether each ray has collided with the collision surface of the target object (as that would be repeating computations that have already been performed in the first stage), as limiting the extent of the raycasting in this manner ensures that only objects between the target object and the ego location are considered in the second raycasting stage.

Alternatively or additionally, determining whether the ray is occluded may comprise determining whether the rays is truncated in that the ray falls outside of a field of view associated with the ego location.

The number of rays that need to be cast depends on the number of reference points. Reducing the number of reference points improves speed and performance, at the cost of reduced accuracy in the occlusion metric. In practice, acceptable performance can be achieved with a relatively small number of grid points (e.g. 10 s or 100 s of grid points, though this may depend on various factors such as the size of the object and its orientation relative to the local 2D view space). This is in contrast to rendering, which might require ray tracing across millions of pixels, with the additional need to assign colour and/or depth values to those pixels (in contrast, the present techniques can be implemented with a binary determination as to whether or not a given object ray is occluded).

In the described embodiments, the occlusion metric is a numerical value indicating the number of occluded rays in proportion to the total number of rays that intersect the collision surface of the target object (this could, for example, be the number of occluded rays in proportion to the total number of rays that intersect the target object, or the number of non-occluded rays in proportion to the total). However, in general it can take any form that usefully indicates an extent of occlusion (including, for example, an array of component occlusion values, indicating occlusion for each reference point separately or, more generally, within different subsets of the space defined by the collision surface of the target object).

Alternatively or in addition to determining occlusion by other objects, for at least one of the rays determined to intersect the collision surface of the target object, determining whether the ray is occluded may comprise determining whether the rays is truncated in that the ray falls outside of a field of view associated with the ego location.

Separate occlusion metrics may be computed that separately quantify the extent of truncation and the extent of occlusion by other object(s). Alternatively or additionally, a combined occlusion metric may be computed that quantifies the overall extent of truncation and occlusion by other object(s). For example, a visibility metric may be computed for each entity and a given sensor, quantifying the extent to which the entity is visible for that sensor in its field of view (essentially a combination of truncation for the given sensor and occlusion by other objects).

The method may comprise the step of outputting the occlusion metric in association with at least one simulated ground truth perception output for the target object.

The occlusion metric and the at least one simulated ground truth perception output may be inputted to a perception error model, which computes therefrom a realistic perception output having a level of perception error that reflects the extent of occlusion.

The realistic perception output may be provided to an autonomous stack under testing, wherein the ego location of the 3D multi-object simulation may be subsequently updated to implement a decision taken by a planner of the autonomous stack in dependence on the realistic perception output.

The reference surface may be located in 3D space based on a location of the target object at a variable distance from the ego location, and the reference points may have a fixed density (independent of the location of the target object).

A point on the 3D bounding box closest to the ego location may be used to locate the reference surface. For example, the reference plane may be located in 3D space so as to intersect that closest point.

The reference surface may be a reference plane in 3D space.

The reference plane may lie substantially perpendicular to a line of sight between the ego location and the target object.

An occlusion metric may be computed for each of multiple target objects of the 3D multi-object simulation.

Multiple occlusion metrics may be computed for the or each target object of the 3D multi-object simulation, based on different fields of view and/or different ego locations.

Further aspects herein provide a computer system comprising one or more computers configured to carry out the method of the first aspect or any embodiment thereof, and a computer program configured to program a computer system to carry out the same.

BRIEF DESCRIPTION

For a better understanding of the present disclosure, and to show how embodiments of the same may be carried into effect, reference is made by way of example only to the following figures, in which.

8

Figure 9:
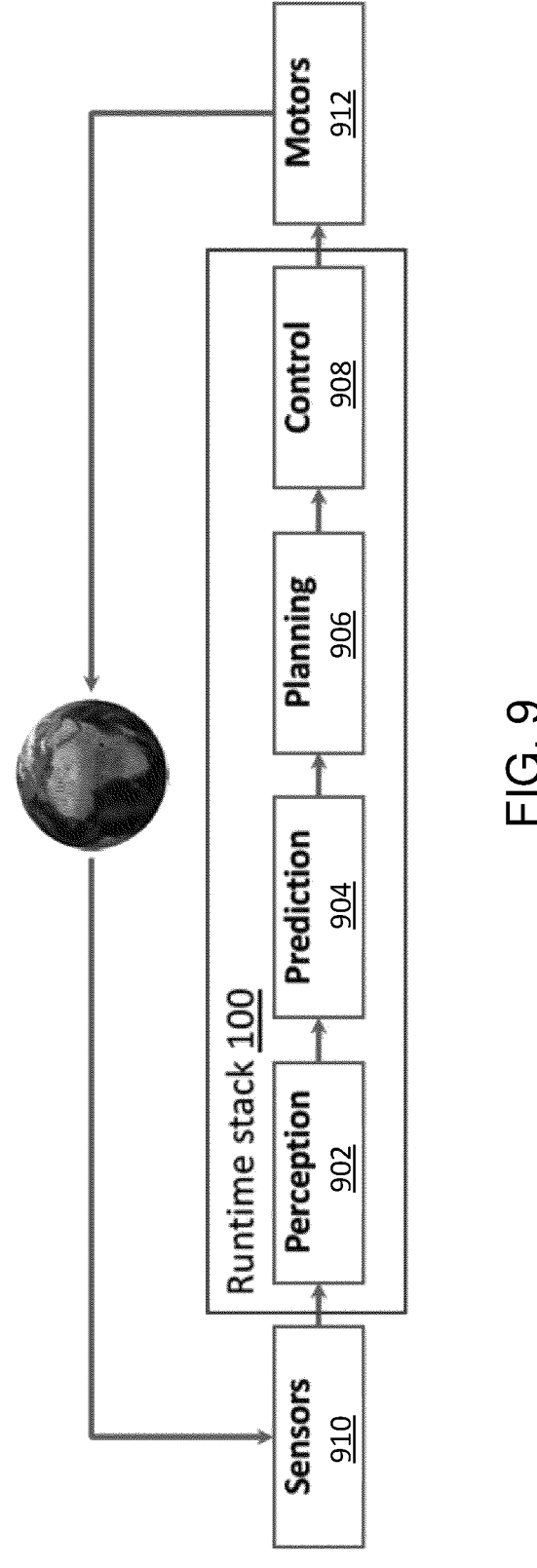
Figure 10:
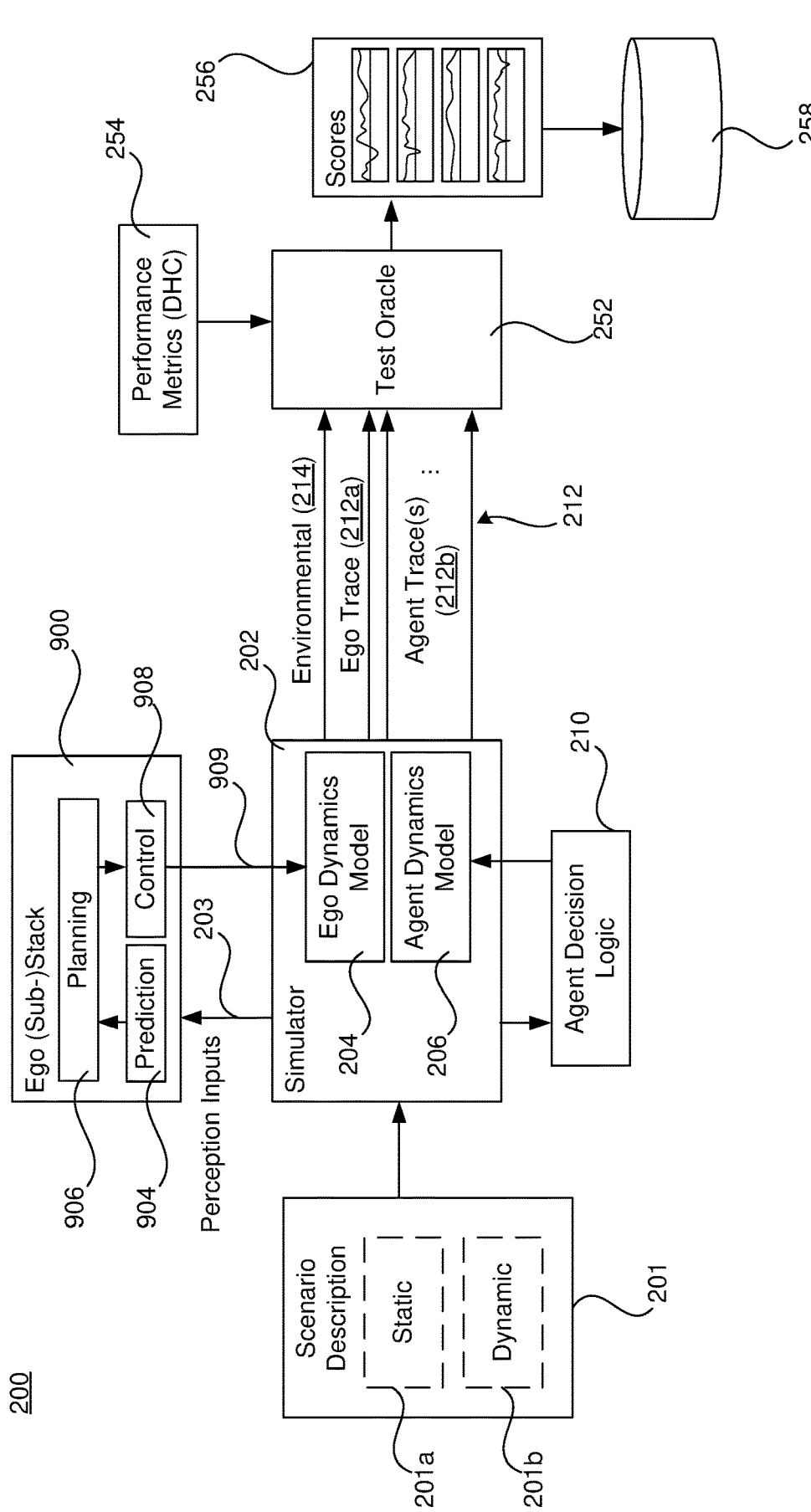

FIG. 9 shows a schematic function block diagram of an autonomous vehicle stack;

FIG. 10 shows a schematic block diagram of a testing pipeline; and

Figure 11:
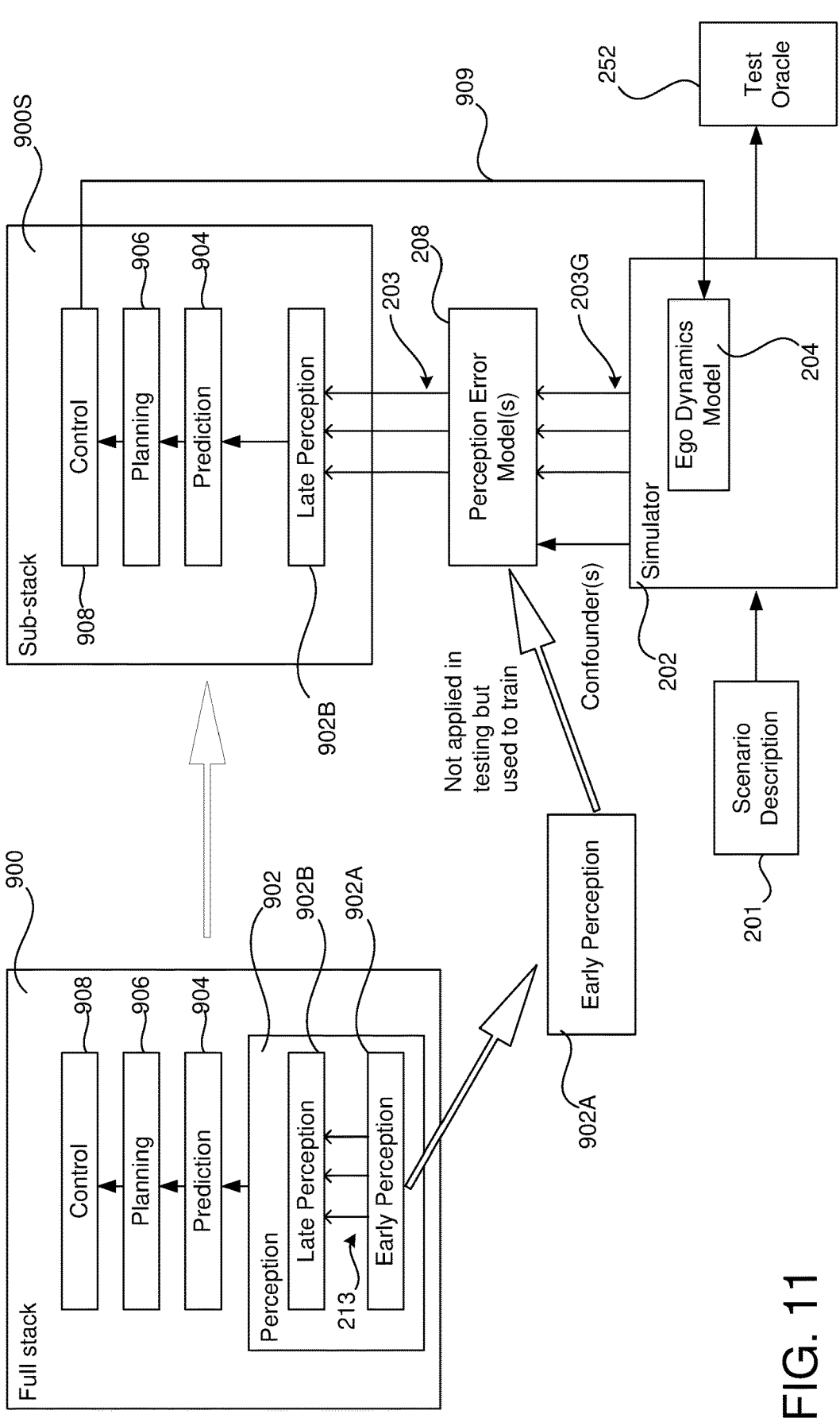

FIG. 11 shows further details of a possible implementation of the testing pipeline based on perception error models, where an occlusion metric serves as a variable of a perception error model.

DETAILED DESCRIPTION

An occlusion metric is computed for a target object in a 3D multi-object simulation. The target object is represented in 3D space by a collision surface and a 3D bounding box. In a reference surface defined in 3D space, a bounding box projection is determined for the target object with respect to an ego location. The bounding box projection is used to determine a set of reference points in 3D space. For each reference point of the set of reference points, a corresponding ray is cast based on the ego location, and it is determined whether the ray is an object ray that intersects the collision surface of the target object. For each such object ray, it is determined whether the object ray is occluded. The occlusion metric conveys an extent to which the object rays are occluded.

Figure 7:
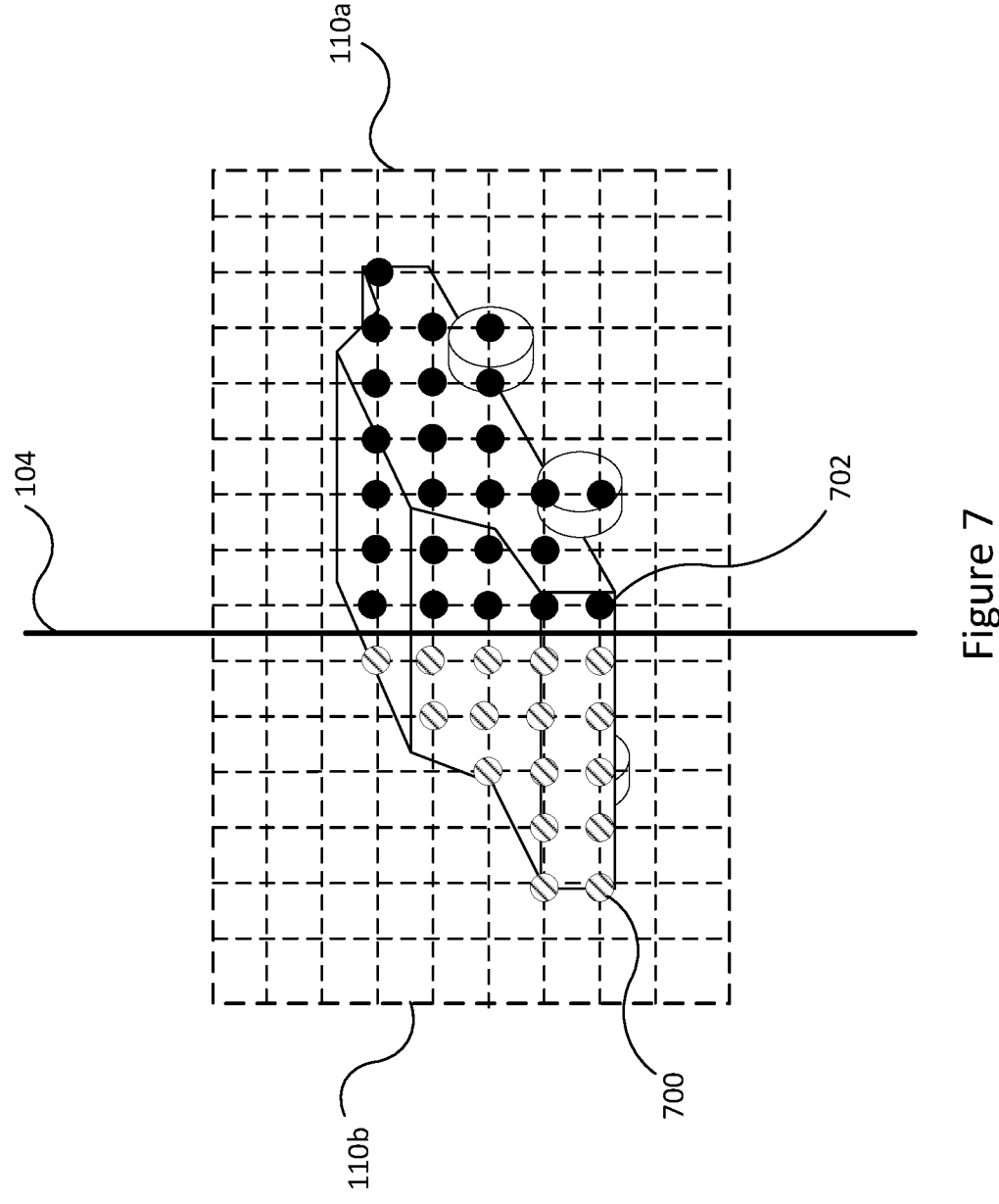
FIG. 7 shows a subset of reference points corresponding to truncated rays.
Figure 8:
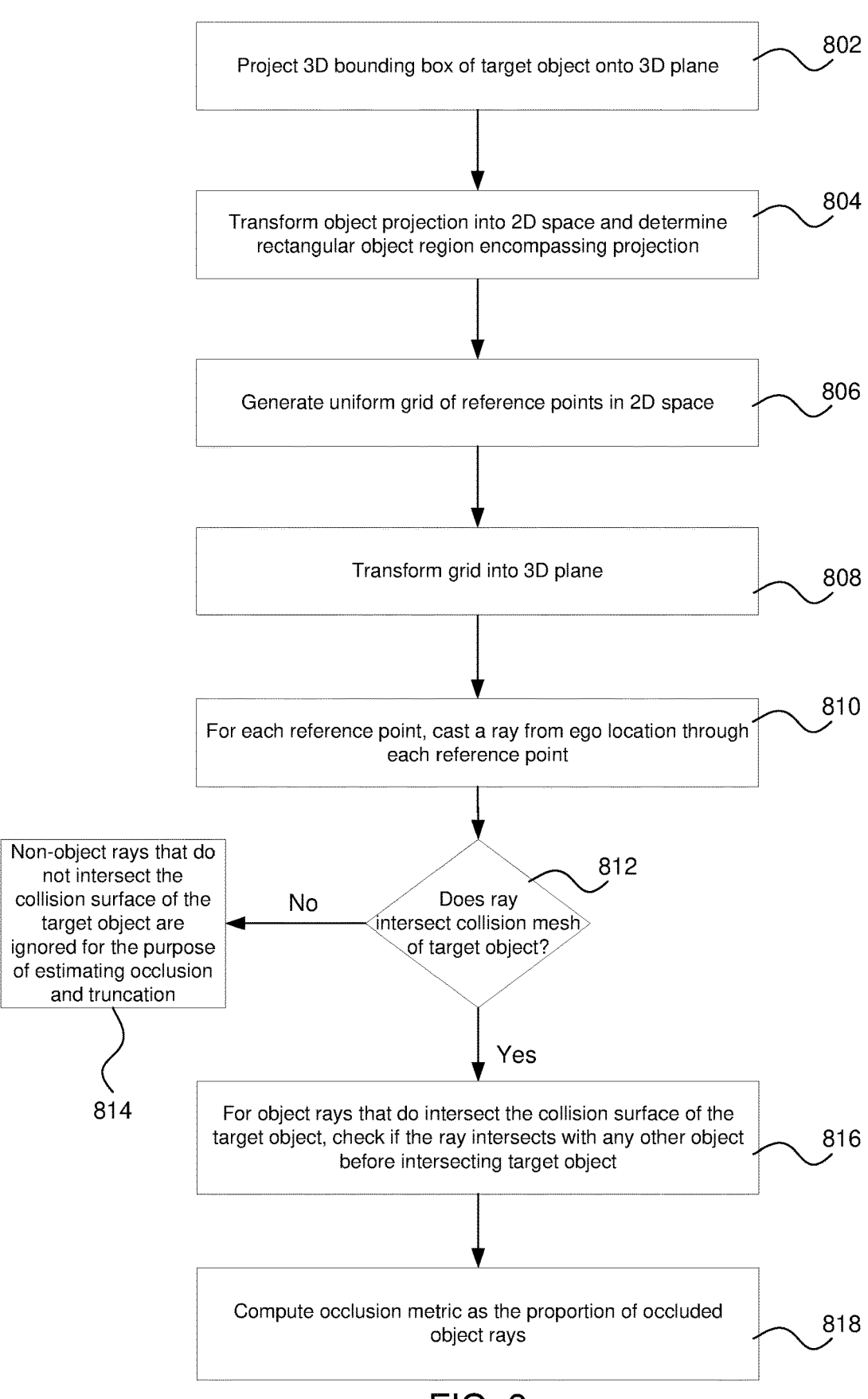
FIG. 8 shows a flowchart for a method of computing an occlusion metric for a target object for a given ego location and field of view.

FIG. 8 shows a flowchart for a method of computing an occlusion metric for a target object, with respect to a particular ego location. An overview of the method is given, followed by further details of the method steps with reference to FIGS. 1 to 7.

The occlusion metric is an estimate of the extent to which an object would be occluded for a sensor located at or near to the ego location, and with a particular orientation that defines a sensor field of view (FOV or frustum). The method can be applied for multiple sensors, at different locations and/or with different FOVs, in which case the method can be applied for sensor configuration under consideration.

In a simulation context, where an AV planner is tested based on simulated perception outputs, the (or each) sensor pose (location and orientation) is updated to implement decisions taken by the planner as the simulation progresses, to provide simulated ego motion. Hence, both the ego location and the FOV can move as the simulation progresses.

The method is applied when an occlusion metric is requested for some ground truth (GT) object (the target object).

A core objective for this algorithm is that it should be able to be used with zero rendering, to calculate an approximate occlusion value of useful accuracy. Performance is also a consideration.

Each object within a 3D simulated scene has an associated 3D bounding box. The objects could be static, dynamic or a mixture of both. At step 802, the 3D bounding box is projected onto a suitable reference surface, lying in 3D space, based on the ego location.

Figure 1:
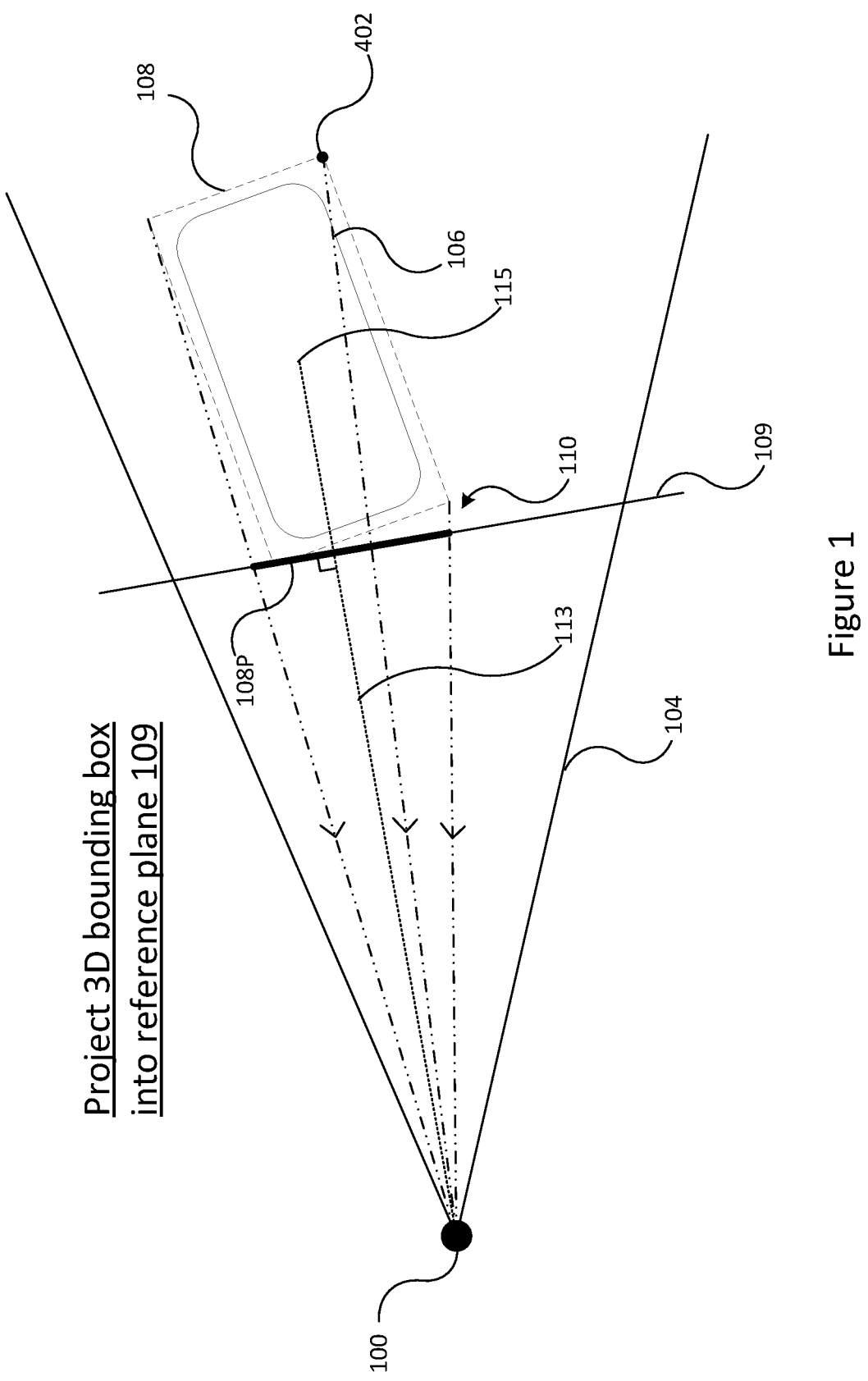
FIG. 1 shows schematic view of a target object in a 3D simulation.

FIG. 1 shows a target object in 3D space represented by a collision surface 106 (collision mesh in this example) and an associated 3D bounding box 108 that substantially encompasses the collision mesh 106. For brevity, the following description refers to the target object 106 to mean the collision surface 106 of the target object (unless otherwise indicated). The ego location is denoted by reference numeral 100. The reference surface is shown to take the form of a "3D" plane 109 and the projection of the bounding box 108 into the 3D plane 109 is denoted by reference numeral 108P. A 3D plane means a plane (flat, 2-dimensional surface) that is defined in 3D space (whereas the term "2D" plane is used to mean the transformation of a 3D plane into 2D space). FIG. 1 is described in further detail below.

Figure 4A:
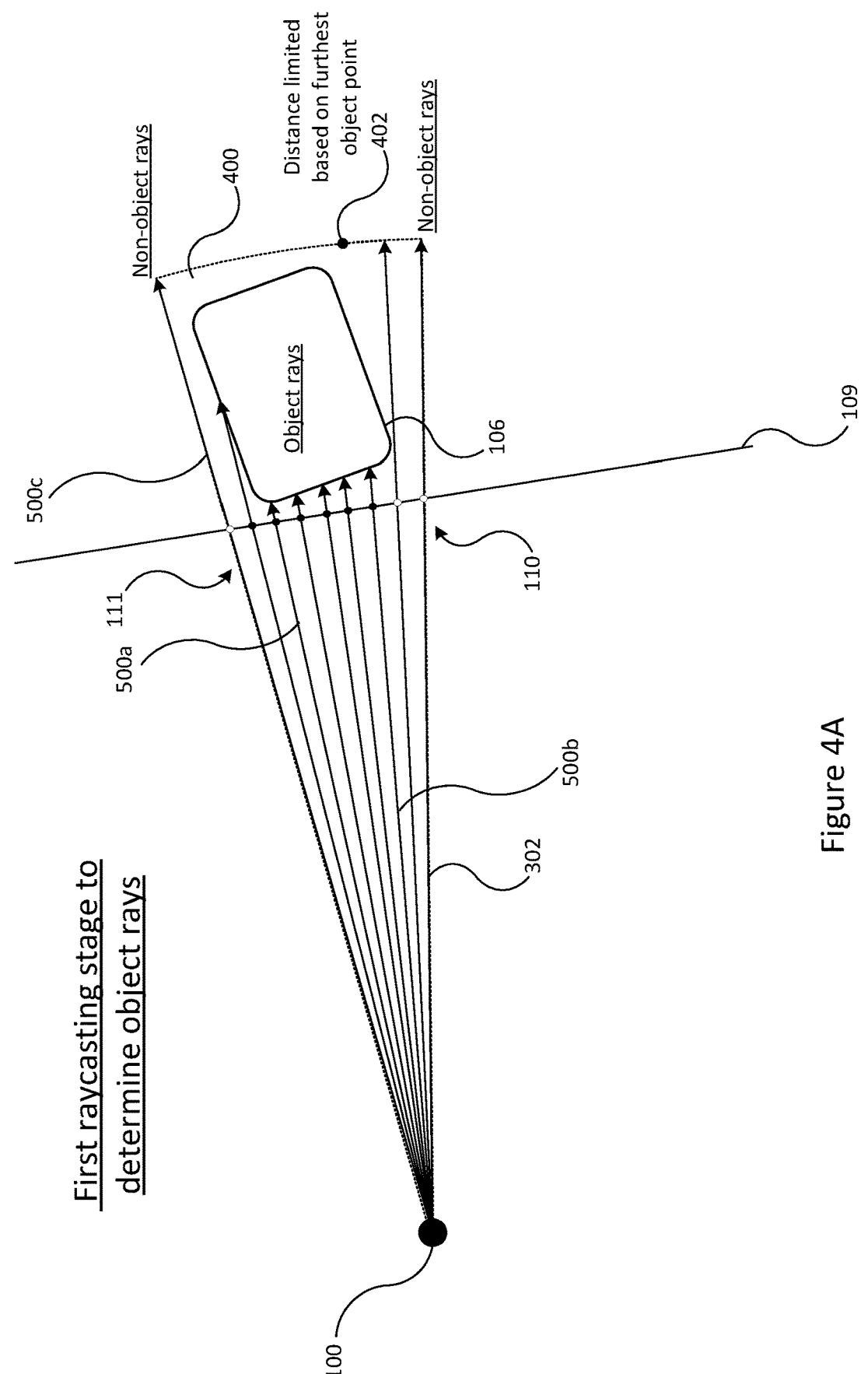
FIG. 4A shows rays cast though a set of reference points in 3D space from an ego location, in order to determine which rays intersect a collision surface of a target object (object rays)
Figure 4B:
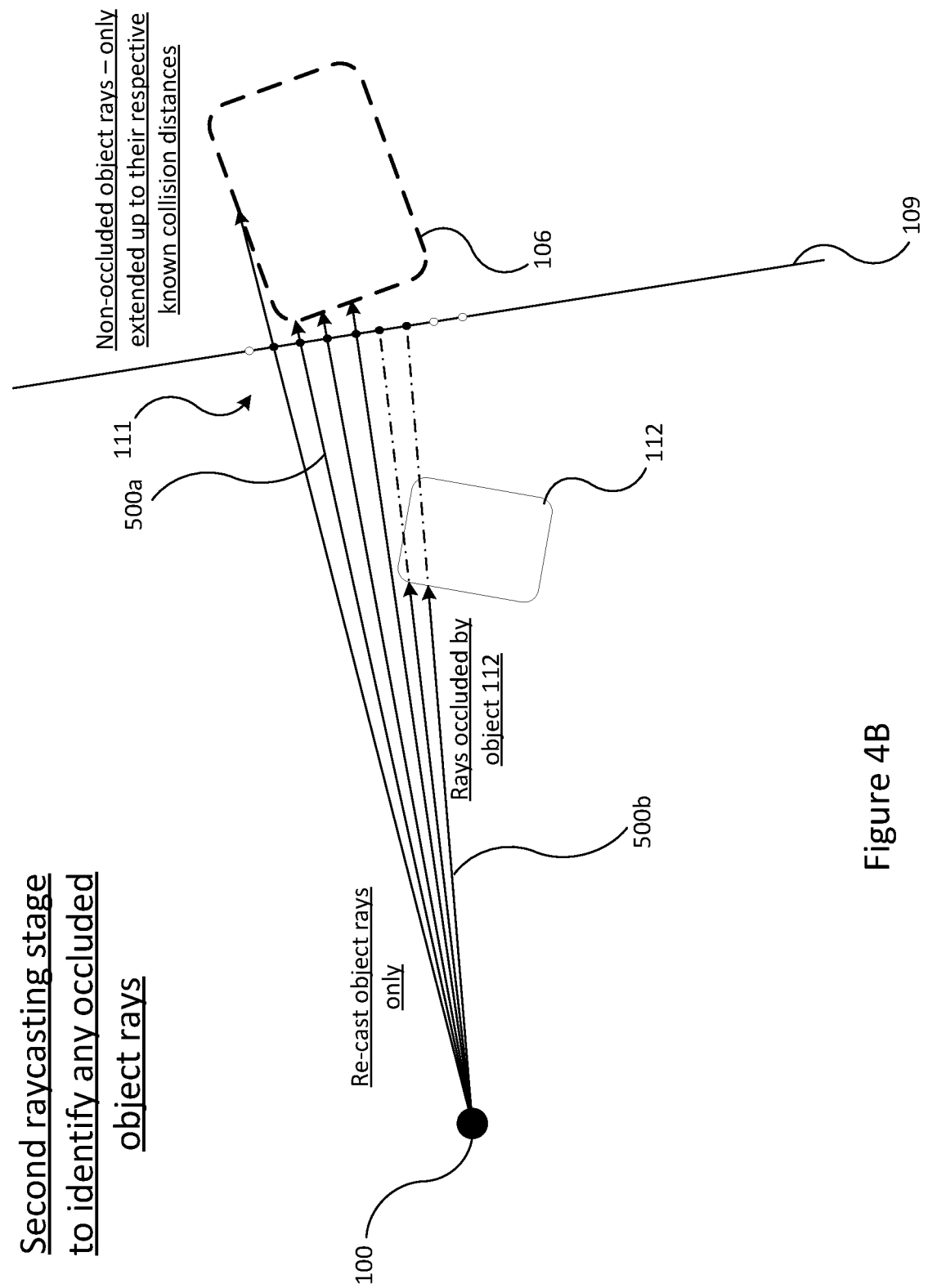
FIG. 4B depicts a second raycasting stage in which only object rays are considered for the purpose of estimating the extent of occlusion.

Ultimately, the aim is to determine a suitable set of reference points in 3D space for the purpose of raycasting. Raycasting is performed in two stages (810, 816), as depicted in FIGS. 4A and 4B respectively. The purpose of the first stage is to find a suitable set of object rays that intersect the collision surface 106 of the target object (distinct from non-object rays along lines that intersect the 3D bounding box 108 but not the collision surface 106). The second stage is performed to identify which of those object rays is occluded (if any). The set of reference points is denoted in the Figures by reference numeral 111.

With reference to FIG. 1, the reference points 111 are determined by projecting the 3D bounding box 108 into the 3D plane 109. The resulting bounding box projection, denoted by reference numeral 108P, defines an area of the 3D plane 109 within which the reference points 111 are distributed (object region 110). Each ray is then cast from the ego location 100 along a line from the ego location 100 and a corresponding one of the reference points 111, as depicted in FIGS. 4A and 4B.

The reference points 111 are not generated in 3D space directly, because it is more efficient to generate them in 2D space and then transform them into 3D space for raycasting.

Figure 2:
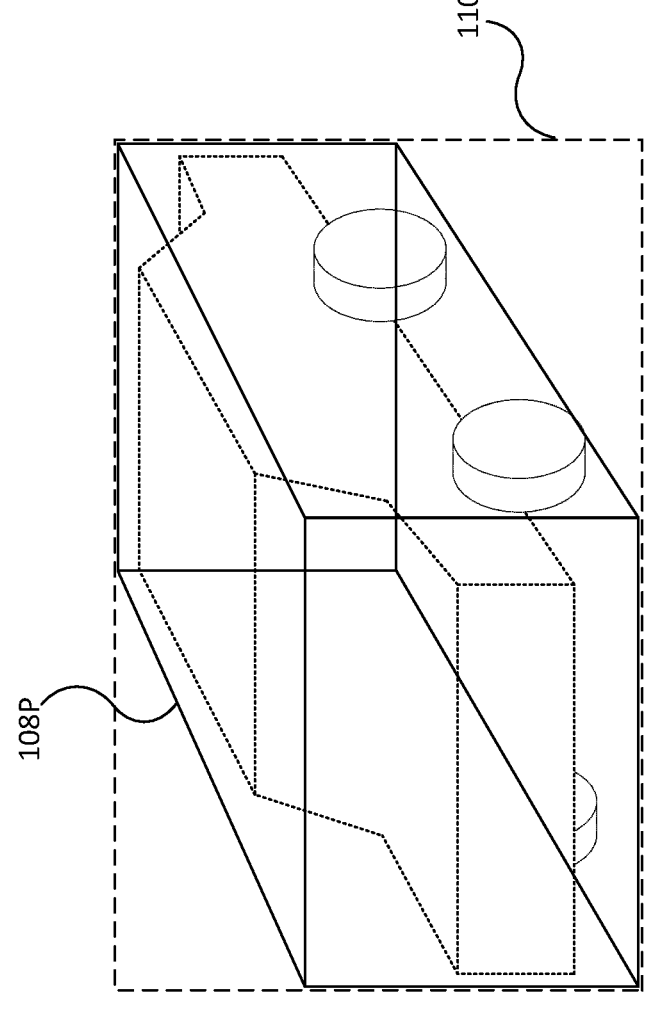
FIG. 2 shows a schematic diagram of a 3D bounding box of the target object and an associated object region determined via projection.

To this end, at step 804, a transformation of the 3D plane 109 into 2D space is determined. That is to say, a transformation is determined that transforms points on the 3D plane 109 to corresponding pairs of 2D spatial coordinates. This, in turn, allows the bounding box projection 108P to be transformed into 2D space, as depicted in FIG. 2.

Figure 3:
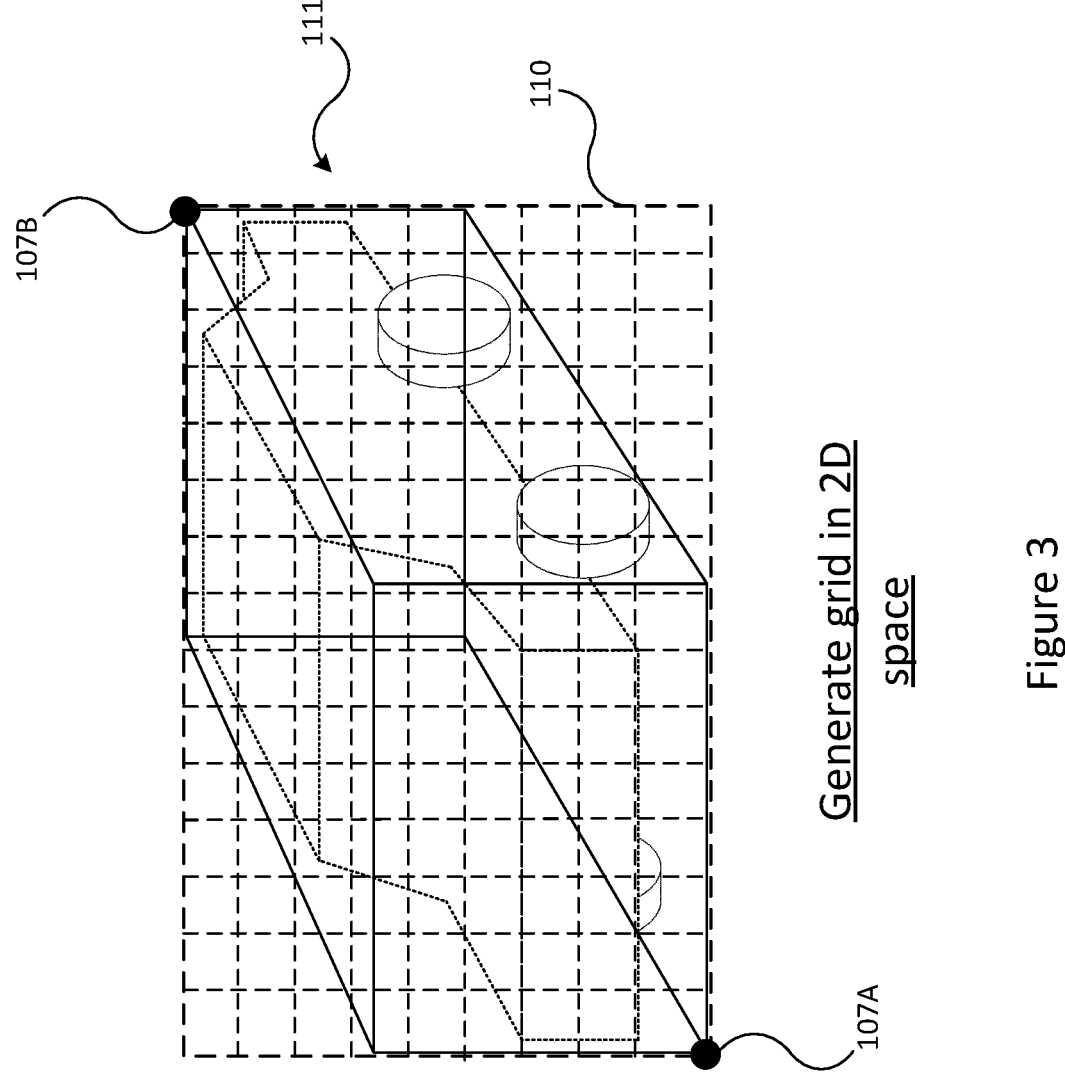
FIG. 3 shows an example of reference points defined by a uniform grid in 2D space.

The set of reference points 111 is defined by imposing a uniform grid on an object region 110 defined by the bounding box projection 108P (see FIG. 3). The uniform grid can be generated in 2D space (FIG. 8, step 806) very efficiently. The object region 110 over which the grid is generated is defined in 2D space by the bounding box projection 108P and the transformation of the 3D plane 109 into 2D space.

FIG. 3 shown the reference points 111 uniformly distributed over a rectangular object area 110 in a grid arrangement (uniform grid). The uniform grid 111 can be generated over the rectangular object area 110 very efficiently in 2D space.

At step 808, the reference points 111 are transformed back into 3D space for the purpose of raycasting, as depicted in FIGS. 4A and 4B. This is achieved by applying the inverse of the transformation determined as step 804. The inverse transformation is such that the transformed grid 111 of FIGS. 4A and 4B lies in the 3D plane 109 within the object region 110.

At step 810 (first raycasting stage), for each reference point of the uniform grid 111, a ray is cast against the collision mesh 106 of the target object only (ignoring other objects in the scene), to determine (step 812) whether or not it hits (collides with) the collision mesh 106 of the target object. This is depicted in FIG. 4A. Rays which do not intersect the collision mesh 106 of the target object (non-object rays)—such as the ray labelled 500c—are ignored (814) for the purpose of estimating occlusion.

As depicted in FIG. 4B, each ray that does intersect the collision mesh 106 of the target object (object ray)—such as the rays labelled 500a and 500b—is then re-cast (816) against all other collision objects in the scene. If, when cast against all other collision objects, the ray no longer collides with the target object (because it collides with a collision mesh of some other object before reaching the target object), that ray is identified as occluded (see FIG. 5).

This allows an occlusion value for reference points that are and aren't occluded to be computed, at step 818.

Figure 6:
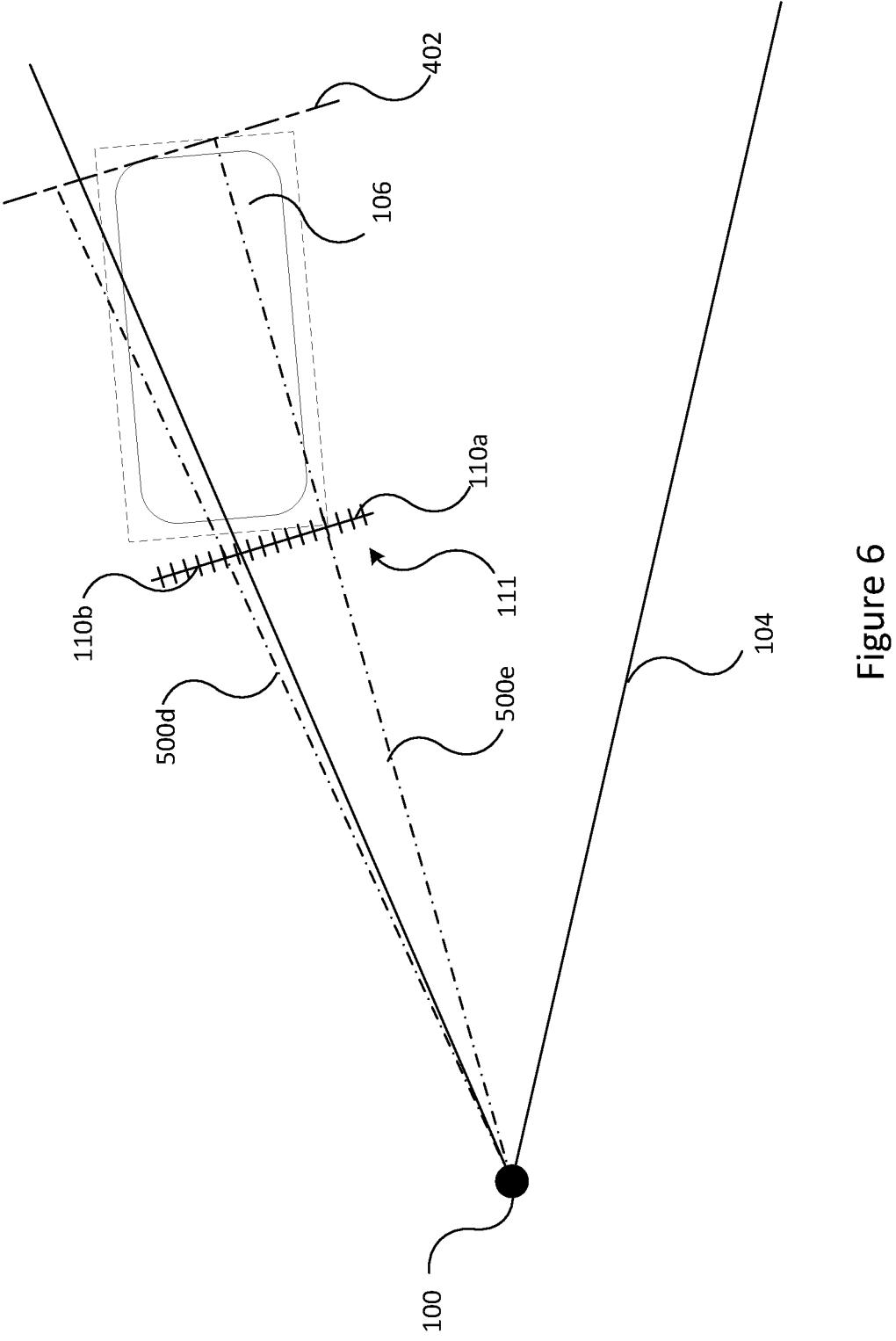
FIG. 6 shows an object that is truncated in the sense of being partially outside of a sensor field of view.

When calculating the occlusion for the (or each) sensor, a check is performed for each reference point check to determine whether it is within the frustrum 104 for the sensor (see FIGS. 6 and 7). Reference points outside of sensor frustrum are said to be truncated. As described below, separate occlusion metrics may be computed for truncation and occlusion by other objects, and/or a combined occlusion metric may be computed (that does not distinguish between truncation and occlusion by other objects). As noted, the term occlusion encompasses not only occlusion by other objects but also truncation in this sense.

Further details of the method, and the 2D and 3D structures to which it is applied, will now be described with reference to FIGS. 1 to 7.

FIG. 1 schematically depicts a 3-dimensional (3D) multi-object simulation, in which there is a target object and a defined ego location 100 in 3D space. There may additionally be other objects in the 3D multi-object simulation, although not shown in FIG. 1.

References are made below to sensors in the context of simulation. However, unless otherwise indicated, this terminology is used to describe the principles in intuitive terms, and does not refer to the simulation of sensor data. In this context, each sensor is represented by an ego location 100 and a field of view 104.

The following examples consider a simulated driving scene. The ego location 100 is a location for an autonomous vehicle (AV) and the method is applied to estimate occlusion from the perspective of an AV sensor assumed to be currently located at the ego location 100. It will be appreciated that other simulated 3D environments and objects within them may be used within the context of the present disclosure. The target object in the example described herein is a vehicle 106, although it will be appreciated that the target object may be any object, such as a building, a pedestrian, traffic lights, etc.

The field of view 104 is defined in 3D space, as a region of 3D space extending out from the ego location 100. This is a 3D region of space that would be perceptible to a sensor at the ego location 100 with a particular orientation. The terms frustrum and filed of view are used interchangeably, and neither term implies a particular shape of the field of view (in particular, the term frustrum is used in the broader sense and does not necessarily imply a pyramid shaped region). The shape of the FOV may vary depending on the sensor configuration it represents, and can depend on various factors including sensor modality (camera, Lidar, Radar etc.), number of sensors, their physical arrangement etc.

Each object in the 3D simulated environment is associated with a 3D bounding box 108. FIG. 2 shows the 3D bounding box 108 associated with the vehicle 106. More specifically, reference numeral 106 denotes a collision mesh of the vehicle contained within the 3D bounding box 108, but this may be referred to simply as the vehicle 106 for simplicity. Raycasting for all objects is performed against their respective collision meshes.

The 3D bounding box 108 shown in FIG. 2 is a cuboid which fully encompasses the vehicle 106 such that the entire volume of the vehicle 106 lies within the 3D bounding box 108. In the present context, a tighter fitting bounding box 108 will generally provide better performance, as it will reduce the number of non-object rays that need to be considered. In any event, the bounding box 108 should essentially encompass the entirety of the collision mesh 106, as any part of the collision mesh 106 outside of the 3D bounding box 108 would not be considered when the occlusion metric is computed.

The collision surface 106 may be used to represent the object and more closely mirrors the shape and size of the object. As noted above, it does not need to exhibit the same level of detail as would be required for rendering.

The 3D plane 109 is located and orientated in 3D space based on a location of the target object 106 (at a variable distance from the ego location 100). In the depicted example, the 3D plane 109 is shown to lie perpendicular to the line 113 between the ego location 100 and a canonical point 115 of the target object 106, such as a center point of its 3D bounding box 108. The 3D plane 106 is located so as to intersect a point on the 3D bounding box 108 closest to the ego location 100 (i.e. the point on the 3D bounding box 108 closest to the ego location 108 lies in the 3D plane 109). The location and orientation of the 3D plane 109 can therefore change if the location of the target object 106 relative to the ego location 100 changes as the simulation progresses.

As shown in FIG. 2, the object region 110 is a rectangular region of the plane 109 that encompasses the projection of the 3D bounding box 108 into the plane 109. An image of the vehicle 106 is depicted in FIG. 2 for ease of reference, but note that the collision mesh is not rendered or projected into the plane 109—the only projection is of the 3D bounding box, which can be implemented efficiently by projecting e.g. just the corners of the bounding box 108.

FIG. 2 shows the object region 110 defined in 2D space. The rectangular object region 110 can be determined in 3D space, within the 3D plane 109, and then transformed into 2D space, or a sufficient number of points of the bounding box projection 108P be transformed into 2D space to allow the rectangular object region 110 to be determined in 3D space.

FIG. 3 shows a set of reference points 111 generated in 2D space within the object region 110, in a uniform grid arrangement. The grid size can be varied depending on the use case. For example, in the present example of a driving environment, a grid spacing of around half a meter provides a good trade off between performance and accuracy, but the actual grid spacing used will be context dependent.

A fixed grid spacing can be used for all objects, irrespective of their distance from the ego location 100, because the plane 109 (and hence the grid within the bounding box projection 110) is located based on the location of the target object 106 rather than the ego location 100. This provides the same occlusion "resolution" for all objects, irrespective of their depth from the ego location 100.

This could also be achieved by fixing the plane 109 relative to the ego location 100, and using a variable grid spacing that depends on the depth of the target object 106. However, that would be more burdensome to implement.

FIG. 4A shows the reference points 111 transformed back into 3D space to allow the first raycasting of step 810 to performed against the grid 111—a ray is cast from the ego location 100 through each reference point on the grid 111 against the collision mesh 106 of the target object only (ignoring other collision objects). That is, in the first raycasting stage, each ray is incrementally extended in the direction of the corresponding reference point from the ego location 100, ad as the ray is extended, the method repeatedly checks whether it has collided with the collision mesh 106 of the target object (but not any other objects).

Each ray terminates either upon colliding with the collision mesh 106 of the target object or, failing that, upon reaching a maximum distance beyond which it is not extended. The maximum distance is defined by a point 402 on the 3D bounding box 108 furthest from the ego location (also depicted in FIG. 1)—on the basis that, if the ray has not collided with the target object 106 by that point, it never will so there is no need to extend it further.

Ray casting is therefore only performed in a region of 3D space 400 defined by the ego location 100 and the 3D bounding box projection 108P. In this particular example, it is defined by the ego location 100 and the outermost points of the grid 111. Although it is simplest to transform the grid points 111 back into the 3D plane 109, they could be transformed into any plane lying parallel to the 3D plane 109 in 3D space, with the grid spacing adjusted accordingly to define the same set of rays.

Rays which do intersect the target object 106, such as the rays labelled 500*a* and 500*b*, are classed as object rays, and are used in the second raycasting step to estimate occlusion. Rays which reach the maximum distance without colliding with the target object 106, such as the ray labelled 500*c*, are classed as non-object rays and are ignored for the purpose of estimating occlusion.

FIG. 4B depicts the second raycasting of step 816. In this stage, only the object rays are considered—so, in this example, the rays labelled 500*a* and 500*b* are considered, but the ray labelled 500*c* in FIG. 4A is not. Each object ray 500*a*, 500*b* is re-cast, but this time against all other collision objects in the scene. That is, for each of the subset of the grid points 111 defining object rays, a ray is incrementally extended from the ego location 100 in the direction of that grid point, and this time the method repeatedly checks whether the ray has collided with the collision surface of any other object.

FIG. 4B shows an example 3D simulation in which the vehicle 106 is partially obscured from the view of the ego location 100 by a collision surface 112 of another object (the other object 112 for brevity). Hence, in the second raycasting of step 816, some of the object rays will collide with the other object before reaching the target object 106.

Whereas, in the first raycasting stage, each ray was cast up to, at most, a maximum distance defined by the furthest point 402 of the target object 106 (or, more precisely, its 3D bounding box 108), in the second ray casting stage each ray is only cast up to, at most, a distance at which it is known to collide with the collision mesh 106 of the target object from the first raycasting stage (the "known collision distance" of that ray). Any object ray that reaches its known collision distance without colliding with another object is classed as not occluded by any other object. Any object ray that does collide with another object before reaching that distance is classed as occluded by another object. In FIG. 4B, the ray labelled 500*b* is shown to collide with the collision surface 112 of the object before reaching the distance at which it would collide with the target object 106—hence, this ray is occluded; however, the ray labelled 500*a* does reach the distance at which it is known to collide with the target object 106, hence is it is not occluded by any other object (but may still be truncated—see below).

In the second raycasting stage, the collision mesh 106 of target object itself can be excluded from the raycasting, i.e. it is not necessary to re-perform the calculations needed to check for collision with the collision mesh 106 of the target object as the ray is extended; instead, the check is reduced to a simpler set of calculation to repeatedly check whether the known collision distance has been reached as the ray is extended.

Alternatively, it would also be possible, in the second ray casting stage, to re-cast "backwards", from the point at which the object ray is known to intersect the collision surface 106 to the ego location 100, to determine whether or not the backwards ray collides with another object before reaching the ego location 100. In that case, the ray is extended no further than the ego location 100. This has the same effect of limiting the distance to which each ray is extended to its known collision distance.

Figure 5:
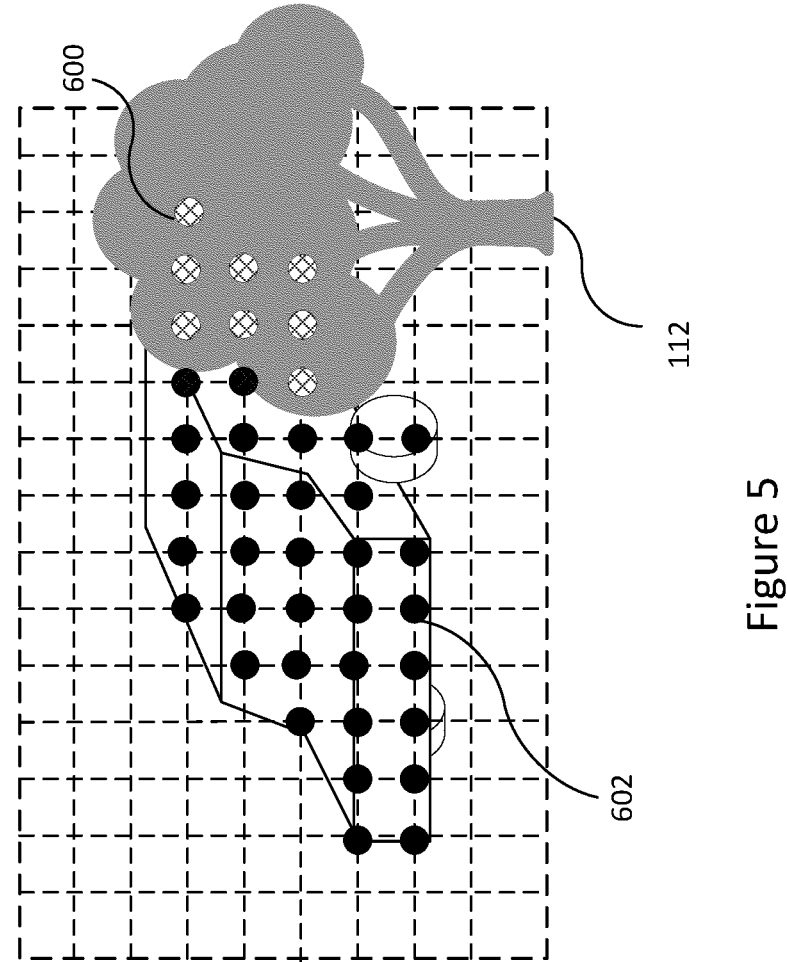
FIG. 5 shows a subset of reference points corresponding to rays that are occluded by another object.

In FIGS. 5 and 7, grid points whose rays do intersect the target object 106 (object rays/object points) are overlaid with circles are object grid points; the other grid points, without such circles, are non-object grid points whose rays necessarily intersect the 3D bounding box 108 but not the actual collision mesh 106 (non-object rays). Both FIGS. 5 and 7 show an image of a car to illustrate the relationship between the grid points and the collision mesh 106, but this is simply for ease of reference, and no such image is actually rendered as part of the method. The subset of object grid points is determined via the raycasting without rendering the collision surface 106. Likewise, the image of the occluding object 112 in FIG. 7 is merely for reference and is not actually rendered for the purpose of estimating the extent to which it occludes the target object 602.

An occlusion metric can be calculated as a result of the ray casting described with reference to FIG. 4.

FIG. 5 shows a representation of the reference points of the object region 110 which are occluded 600 by the object 112, i.e. associated with the occluded rays 500_b_, those which are associated with detectable parts 602 of the vehicle 106, i.e. parts with which rays 500_a_ collide and are not occluded, and the reference points at which no part of the vehicle 106 is associated, i.e. rays 500_c_ do not intersect with the vehicle 106.

The occlusion value is a numerical representation of the proportion of the target object which is occluded from the perspective of the ego location 100. It indicates the number of occluded rays 500_b_ in proportion to the total number of rays 500_a_, 500_b_ which intersect the collision surface of the target object.

The occlusion value may be calculated as a percentage of the occluded reference points 600 as a proportion of all of the intersecting reference points 600, 602. In the example of FIG. 5, there are 8 non-visible occluded reference points 600 and 32 visible intersecting reference points 602. Therefore, the occlusion value is 20%.

The occlusion value may be calculated in some other way. For example, the occlusion value may be presented as a fraction, decimal, or ratio. Alternatively, the occlusion value may be the raw reference point counts for each type of reference point 600, 602.

FIGS. 6 and 7 consider truncation, i.e. the extent to which an object is outside of the field of view 104.

A single metric can accommodate both truncation and occlusion by other objects. In this case, both object points outside of the sensor field of view and object points occluded by other objects are classed as occluded; non-occluded points are points within the field of view 104 that are also not occluded by any other object.

Alternatively, separate occlusion and truncated metrics may be provided. In this case, the occlusion metric may be defined with respect to only the object points within the field of view 104 (e.g. if 50% of the object points lie outside the field of view, the object would be 50% truncated; if one quarter of the remaining 50% of the object points inside the field of view are occluded by other object(s), then the target object would be 25% occluded). Alternatively, the occlusion value may not take into account any truncation of the target object.

The following examples consider separate occlusion and truncation metrics, but the same principles apply to a combined metric.

FIG. 6 shows a top-down view of a 3D environment in which the vehicle 106 is only partially in the field of view 104 of the ego location 100.

It can be seen that part of the object region 110_b_ is outside the field of view 104 while another part 110_a_ is inside the field of view 104. The reference points which lie on each of these parts can be used to determine the truncation value, as shown in FIG. 7.

As described with reference to FIG. 4, rays 500 are cast from the ego location 100 through each reference point of the object region 110. As with occlusion, some rays may intersect with the vehicle 106 while others do not. In the case of truncation, some of the rays which intersect with the collision surface of the vehicle 106 fall outside of the field of view 104. For example, ray 500_d_ intersects with the vehicle 106 but does not fall within the field of view 104, while the ray 500_e_ both intersects the collision surface of the vehicle 106 and falls within the field of view 104.

The reference points associated with the rays 500_e_ which both intersect with the vehicle 106 and fall within the field of view 104 are referred to as visible intersecting grid points 702 as they are visible to the ego location 100. The reference points associated with the rays 500_d_ which intersect with the vehicle 106 but do not fall within the field of view 104 are referred to as non-visible intersecting grid points 700.

Similarly to the occlusion value, the truncation value is a numerical value which represented the proportion of the target object which is visible to the ego location 100. It may be a percentage of the intersecting reference points which are outside the field of view 104 so not visible to the ego location 100. In the example of FIG. 7, there are 16 external intersecting reference points 700 and 24 internal intersecting grid points 702. Therefore, the truncation value is 33%. This value may be represented in some other way, for example as a fraction, ratio, decimal, or as raw values.

In order to determine which of the intersecting reference points are internal 702, where internal refers to lying within the field of view 104, and which are external 700, wherein external refers to lying outside the field of view 104, the location of the edge of the field of view 104 is determined with respect to the object region 110. The location of the edge of the field of view 104 is used to define the parts of the 2D object region which fall inside and outside of the field of view 104. Once these parts 110_a_, 110_b_ have been defined, the number of intersecting reference points 700, 702 in each part 110_a_, 110_b_ is determined, e.g. by counting, such that the internal intersecting reference points 702 lie in the part of the object region 110_a_ which lies inside the field of view 104 and the external intersecting reference points 700 lie in the part of the object region 110_b_ which lies outside the field of view 104.

In some embodiments, the truncation value may be determined for every object in the 3D environment. Alternatively, the edge of the field of view 104 is located within the 3D environment and compared to the locations of the bounding box projections 110. If the edge of the field of view 104 intersects with a bounding box projection 110, the truncation value is evaluated for the object associated with said bounding box projection 110. Otherwise, the truncation value is not evaluated for the object.

The 3D environment may comprise a number of objects. The steps set out above may be performed for each object in the 3D environment. There may be a predefined maximum distance from the ego location 100 beyond which any objects in the 3D environment are not considered, i.e. truncation and/or occlusion values are not calculated for these objects. The maximum distance may depend on the simulated environment and/or the object located at the ego location 100. For example, if the object at the ego location 100 is a camera, the maximum distance may be defined to be a distance from the camera at which any objects are not well defined in an image generated by the camera. In the present example of a sensor within a driving environment, the maximum distance may be of the order of 100 meters.

The information extracted from the 3D simulation does not comprise colour values associated with objects with which the cast rays collide or any other data for rendering a 2D image of the 3D simulation.

AV Testing Application:

An example application of the above techniques will now be applied. In this context, the occlusion metric serves as a confounder (variable) of a perception error model.

An interface of the simulator provides a "world first" view with an ego-centric meta layer on top. E.g. for a completely occluded object, the interface still provides a location of the vehicle and a separate indication that it is 100% occluded.

FIG. 9 shows a highly schematic block diagram of a runtime stack 900 for an autonomous vehicle (AV), also referred to herein as an ego vehicle (EV). The run time stack 900 is shown to comprise a perception system 902, a prediction system 904, a planner 906 and a controller 908.

In a real-world context, the perception system 902 would receive sensor outputs from an on-board sensor system 910 of the AV and uses those sensor outputs to detect external agents and measure their physical state, such as their position, velocity, acceleration etc. The on-board sensor system 910 can take different forms but generally comprises a variety of sensors such as image capture devices (cameras/optical sensors), LiDAR and/or RADAR unit(s), satellite-positioning sensor(s) (GPS etc.), motion sensor(s) (accelerometers, gyroscopes etc.) etc., which collectively provide rich sensor data from which it is possible to extract detailed information about the surrounding environment and the state of the AV and any external actors (vehicles, pedestrians, cyclists etc.) within that environment. The sensor outputs typically comprise sensor data of multiple sensor modalities such as stereo images from one or more stereo optical sensors, Lidar, Radar etc. Stereo imaging may be used to collect dense depth data, with Lidar/Radar etc. proving potentially more accurate but less dense depth data. More generally, depth data collection from multiple sensor modalities may be combined in a way that preferably respects their respective levels of uncertainty (e.g. using Bayesian or non-Bayesian processing or some other statistical process etc.). Multiple stereo pairs of optical sensors may be located around the vehicle e.g. to provide full 360° depth perception.

The perception system 902 comprises multiple perception components which co-operate to interpret the sensor outputs and thereby provide perception outputs to the prediction system 904. External agents may be detected and represented probabilistically in a way that reflects the level of uncertainty in their perception within the perception system 902.

In a simulation context, depending on the nature of the testing—and depending, in particular, on where the stack 900 is sliced—it may or may not be necessary to model the on-board sensor system 900. With higher-level slicing, simulated sensor data is not required therefore complex sensor modelling is not required.

The perception outputs from the perception system 902 are used by the prediction system 904 to predict future behaviour of external actors (agents), such as other vehicle in the vicinity of the AV.

Predictions computed by the prediction system 904 are provided to the planner 906, which uses the predictions to make autonomous driving decisions to be executed by the AV in a given driving scenario. A scenario is represented as a set of scenario description parameters used by the planner 906. A typical scenario would define a drivable area and would also capture predicted movements of any external agents (obstacles, form the AV's perspective) within the drivable area. The driveable area can be determined using perception outputs from the perception system 902 in combination with map information, such as an HD (high-definition) map.

A core function of the planner 906 is the planning of trajectories for the AV (ego trajectories) taking into account predicted agent motion. This may be referred to as maneuver planning. A trajectory is planned in order to carry out a desired goal within a scenario. The goal could for example be to enter a roundabout and leave it at a desired exit; to overtake a vehicle in front; or to stay in a current lane at a target speed (lane following). The goal may, for example, be determined by an autonomous route planner (not shown).

The controller 908 executes the decisions taken by the planner 906 by providing suitable control signals to an on-board actor system 912 of the AV. In particular, the planner 906 plans manoeuvres to be taken by the AV and the controller 908 generates control signals in order to execute those manoeuvres.

A testing pipeline for testing the performance of all or part of an autonomous vehicle (AV) runtime stack is described below. The testing pipeline is highly flexible and can be accommodate many forms of AV stack, operating at any level of autonomy. Note, the term autonomous herein encompasses any level of full or partial autonomy, from Level 1 (driver assistance) to Level 5 (complete autonomy).

However a stack is "sliced" for the purpose of testing, the idea of simulation-based testing for autonomous is to run a simulated driving scenario that an ego agent must navigate, often within a static drivable area (e.g. a particular static road layout) but typically in the presence of one or more other dynamic agents such as other vehicles, bicycles, pedestrians etc. (also referred to as actors or external agents). Simulated perception inputs are derived from the simulation, which in turn feed into the stack or sub-stack under testing, where they are processed in exactly the same way as corresponding physical perception inputs would be, so as to drive autonomous decision making within the (sub-)stack. The ego agent is, in turn, caused to carry out those decisions, thereby simulating the behaviours or a physical autonomous vehicle in those circumstances. The simulated perception inputs changes as the scenario progresses, which in turn drives the autonomous decision making within the (sub-) stack being tested. The results can be logged and analysed in relation to safety and/or other performance criteria. Note the term perception input as used herein can encompass "raw" or minimally-processed sensor data (i.e. the inputs to the lowest-level perception components) as well as higher-level outputs (final or intermediate) of the perception system that serve as inputs to other component(s) of the stack (e.g. other perception components and/or prediction/planning).

Slicing refers to the set or subset of stack components subject to testing. This, in turn, dictates the form of simulated perception inputs that need to be provided to the (sub-)stack, and the way in which autonomous decisions.

For example, testing of a full AV stack, including perception, would typically involve the generation of sufficiently realistic simulated sensor inputs (such as photorealistic image data and/or equally realistic simulated lidar/radar data etc.) that, in turn, can be fed to the perception subsystem and processed in exactly the same way as real sensor data. The resulting outputs of the perception system would, in turn, feed the higher-level prediction and planning system, testing the response of those components to the simulated sensor inputs. In place of the physical actor system, an ego vehicle dynamics model could then be used to translate the resulting control signals into realistic motion of an "ego agent" within the simulation, thereby simulating the response of an ego vehicle to the control signal.

By contrast, so-called "planning-level" simulation would essentially bypass the prediction system. A simulator would provide simpler, higher-level simulated perception inputs that can be fed directly to the prediction and planning components, i.e. rather than attempting to simulate the sensor inputs to the perception system, the simulator would instead simulate the outputs of the perception system which are then inputted to the prediction/planning systems directly. As a general rule, the "lower down" the stack is sliced, the more complex the required simulated perception inputs (ranging from full sensor modelling at one extreme to simple simulated fused location/orientation measurements etc. at the other, which can be derived straightforwardly using efficient techniques like ray tracing).

Between those two extremes, there is scope for many different levels of input slicing, e.g. testing only a subset of the perception system, such as "later" perception components, i.e., components such as filters or fusion components which operate on the outputs from lower-level perception components (such as object detectors, bounding box detectors, motion detectors etc.).

In any of the above, for control for stacks where control is separable from planning, control could also be bypassed (output slicing). For example, if a manoeuvre planner of the stack plans in terms of trajectories that would feed into a control system within the full stack, for the purpose of the simulation, it could simply be assumed that the ego agent follows each planned trajectory exactly, which bypasses the control system and removes the need for more in-depth vehicle dynamics modelling. This may be sufficient for testing certain planning decisions.

FIG. 10 shows a schematic block diagram of a testing pipeline 200. The testing pipeline 200 is shown to comprise a simulator 202 and a test oracle 252. The simulator 202 runs simulations for the purpose of testing all or part of an AV run time stack.

By way of example only, the description of the testing pipeline 200 makes reference to the runtime stack 900 of FIG. 9 to illustrate some of the underlying principles by example. As discussed, it may be that only a sub-stack of the run-time stack is tested, but for simplicity, the following description refers to the AV stack 900 throughout; noting that what is actually tested might be only a subset of the AV stack 900 of FIG. 9, depending on how it is sliced for testing. In FIG. 10, reference numeral 900 can therefore denote a full AV stack or only sub-stack depending on the context.

FIG. 10 shows the prediction, planning and control systems 904, 906 and 908 within the AV stack 900 being tested, with simulated perception inputs 203 fed from the simulator 202 to the stack 900. However, this does not necessarily imply that the prediction system 904 operates on those simulated perception inputs 203 directly (though that is one viable slicing, in which case the simulated perception inputs 203 would correspond in form to the final outputs of the perception system 902). For instance, in the example depicted in FIG. 11 and described in detail below, the AV stack 900 is sliced such that a subset of late perception components 902B (only) are included in a tested sub-stack 900S, together with the prediction, planning and control components 904, 906 and 908 (in this case, the simulated perception inputs 203 would correspond to the outputs of the remaining, earlier perception components that are not implemented with the stack 900 during testing). Where the full perception system 902 is implemented in the stack being tested (or, at least, where one or more lower-level perception components that operate on raw sensor data are included), then the simulated perception inputs 203 would comprise simulated sensor data.

The simulated persecution inputs 203 are used as a basis for prediction and, ultimately, decision-making by the planner 908. The controller 908, in turn, implements the planner's decision decisions by outputting control signals 909. In a real-world context, these control signals would drive the physical actor system 912 of AV. The format and content of the control signals generated in testing are the same as they would be in a real-world context. However, within the testing pipeline 200, these control signals 909 instead drive the ego dynamics model 204 to simulate motion of the ego agent within the simulator 202.

To the extent that external agents exhibit autonomous behaviour/decision making within the simulator 202, some form agent decision logic 210 is implemented to carry out those decisions and drive external agent dynamics within the simulator 202 accordingly. The agent decision logic 210 may be comparable in complexity to the ego stack 900 itself or it may have a more limited decision-making capability. The aim is to provide sufficiently realistic external agent behaviour within the simulator 202 to be able to usefully test the decision-making capabilities of the ego stack 900. In some contexts, this does not require any agent decision making logic 210 at all (closed-loop simulation), and in other contexts useful testing can be provided using relatively limited agent logic 210 such as basic adaptive cruise control (ACC). Similar to the ego stack 100, any agent decision logic 210 is driven by outputs from the simulator 202, which in turn are used to derive inputs to the agent dynamics models 206 as a basis for the agent behaviour simulations.

A simulation of a driving scenario is run in accordance with a scenario description 201, having both static and dynamic layers 201a, 201b.

The static layer 201a defines static elements of a scenario, which would typically include a static road layout.

The dynamic layer 201b defines dynamic information about external agents within the scenario, such as other vehicles, pedestrians, bicycles etc. The extent of the dynamic information provided can vary. For example, the dynamic layer 201b may comprise, for each external agent, a spatial path to be followed by the agent together with one or both motion data and behaviour data associated with the path.

In simple closed-loop simulation, an external actor simply follows the spatial path and motion data defined in the dynamic layer that is non-reactive i.e. does not react to the ego agent within the simulation. Such closed-loop simulation can be implemented without any agent decision logic 210.

However, in "open-loop" simulation, the dynamic layer 201b instead defines at least one behaviour to be followed along a static path (such as an ACC behaviour). In this, case the agent decision logic 210 implements that behaviour within the simulation in a reactive manner, i.e. reactive to the ego agent and/or other external agent(s). Motion data may still be associated with the static path but in this case is less prescriptive and may for example serve as a target along the path. For example, with an ACC behaviour, target speeds may be set along the path which the agent will seek to match, but the agent decision logic 910 might be permitted to reduce the speed of the external agent below the target at any point along the path in order to maintain a target headway from a forward vehicle.

The output of the simulator 202 for a given simulation includes an ego trace 212*a* of the ego agent and one or more agent traces 212*b* of the one or more external agents (traces 212).

A trace is a complete history of an agent's behaviour within a simulation having both spatial and motion components. For example, a trace may take the form of a spatial path having motion data associated with points along the path such as speed, acceleration, jerk (rate of change of acceleration), snap (rate of change of jerk) etc.

Additional information is also provided to supplement and provide context to the traces 212. Such additional information is referred to as "environmental" data 214 which can have both static components (such as road layout) and dynamic components (such as weather conditions to the extent they vary over the course of the simulation).

To an extent, the environmental data 214 may be "pass-through" in that it is directly defined by the scenario description 201 and is unaffected by the outcome of the simulation. For example, the environmental data 214 may include a static road layout that comes from the scenario description 201 directly. However, typically the environmental data 214 would include at least some elements derived within the simulator 202. This could, for example, include simulated weather data, where the simulator 202 is free to change whether change weather conditions as the simulation progresses. In that case, the weather data may be time-dependent, and that time dependency will be reflected in the environmental data 214.

The test oracle 252 receives the traces 212 and the environmental data 214, and scores those outputs against a set of predefined numerical performance metrics to 254. The performance metrics 254 encode what may be referred to herein as a "Digital Highway Code" (DHC). Some examples of suitable performance metrics are given below.

The scoring is time-based: for each performance metric, the test oracle 252 tracks how the value of that metric (the score) changes over time as the simulation progresses. The test oracle 252 provides an output 256 comprising a score-time plot for each performance metric.

The metrics 256 are informative to an expert and the scores can be used to identify and mitigate performance issues within the tested stack 900.

Perception Error Models

FIG. 11 illustrates a particular form of slicing and uses reference numerals 900 and 900S to denote a full stack and sub-stack respectively. It is the sub-stack 900S that would be subject to testing within the testing pipeline 200 of FIG. 10.

A number of "later" perception components 902B form part of the sub-stack 900S to be tested and are applied, during testing, to the simulated perception inputs 203. The late perception components 902B could, for example, include filtering or other fusion components that fuse perception inputs from multiple earlier perception components.

In the full stack 900, the late perception component 902B would receive actual perception inputs 213 from earlier perception components 902A. For example, the earlier perception components 902A might comprise one or more 2D or 3D bounding box detectors, in which case the simulated perception inputs provided to the late perception components could include simulated 2D or 3D bounding box detections, derived in the simulation via ray tracing. The earlier perception components 902A would generally include component(s) that operate directly on sensor data.

With this slicing, the simulated perception inputs 203 would correspond in form to the actual perception inputs 213 that would normally be provided by the earlier perception components 902A. However, the earlier perception components 902A are not applied as part of the testing, but are instead used to train one or more perception error models 208 that can be used to introduce realistic error, in a statistically rigorous manner, into the simulated perception inputs 203 that are fed to the later perception components 902B of the sub-stack 900 under testing.

Such perception error models may be referred to as Perception Statistical Performance Models (PSPMs) or, synonymously, "PRISMs". Further details of the principles of PSPMs, and suitable techniques for building and training them, may be found in European Patent Application No. 20168311.7, incorporated herein by reference in its entirety. The idea behind PSPMs is to efficiently introduce realistic errors into the simulated perception inputs provided to the sub-stack 902B (i.e. that reflect the kind of errors that would be expected were the earlier perception components 902A to be applied in the real-world). In a simulation context, "perfect" ground truth perception inputs 203G are provided by the simulator, but these are used to derive more realistic perception inputs 203 with realistic error introduced by the perception error models(s) 208.

As described in the aforementioned reference, a PSPM can be dependent on one or more variables representing physical condition(s) ("confounders"), allowing different levels of error to be introduced that reflect different possible real-world conditions. Hence, the simulator 202 can simulate different physical conditions (e.g. different weather conditions) by simply changing the value of a weather confounder(s), which will, in turn, change how perception error is introduced.

The above occlusion metric serves as a confounder for the target object to which it relates.

The late perception components 902B within the sub-stack 900S process the simulated perception inputs 203 in exactly the same way as they would process the real-world perception inputs 213 within the full stack 900, and their outputs, in turn, drive prediction, planning and control.

References herein to components, functions, modules and the like, denote functional components of a computer system which may be implemented at the hardware level in various ways. A computer system comprises one or more computers that may be programmable or non-programmable. A computer comprises one or more processors which carry out the functionality of the aforementioned functional components. A processor can take the form of a general-purpose processor such as a CPU (Central Processing unit) or accelerator (e.g. GPU) etc. or more specialized form of hardware processor such as an FPGA (Field Programmable Gate Array) or ASIC (Application-Specific Integrated Circuit). That is, a processor may be programmable (e.g. an instruction-based general-purpose processor, FPGA etc.) or non-programmable (e.g. an ASIC). Such a computer system may be implemented in an onboard or offboard context.

The invention claimed is:

1. A computer-implemented method of computing an occlusion metric for a target object in a 3D multi-object simulation that represents real-world conditions, the method comprising:

determining, in a reference surface defined in 3D space, a bounding box projection for the target object of the 3D multi-object simulation, wherein the target object is represented in 3D space by a collision surface and a 3D bounding box, and the bounding box projection is determined by projecting the 3D bounding box into the reference surface with respect to an ego location;

using the bounding box projection to determine a set of reference points in 3D space for raycasting within a region of 3D space defined by the ego location and the bounding box projection;

for each reference point of the set of reference points, casting a corresponding ray within said region of 3D space based on the ego location, and determining whether the corresponding ray intersects the collision surface of the target object;

for each ray that is determined to intersect the collision surface of the target object, determining whether the ray is occluded; and computing the occlusion metric, the occlusion metric conveying an extent to which each ray that intersects the collision surface of the target object is occluded;

wherein the occlusion metric is used to determine different levels of error that reflect different possible real-world conditions.

2. The method of claim 1, wherein the set of reference points is determined in 3D space by:

determining a transformation of the reference surface into 2D space, in order to generate the set of reference points in 2D space within an object region defined by the bounding box projection, wherein the set of reference points is optionally a set of uniform grid points generated in 2D space within a rectangular object region that substantially encompasses the bounding box projection; and transforming the set of reference points from 2D space into 3D space for raycasting.

3. The method of claim 1, wherein the occlusion metric is a numerical value indicating a number of occluded rays in proportion to a total number of rays that intersect the collision surface of the target object.

4. The method of claim 1, wherein, for at least one of the rays determined to intersect the collision surface of the target object, determining whether the ray is occluded comprises determining whether the ray intersects a collision surface of at least one other object of the 3D multi-object simulation between the ego location and the collision surface of the target object.

5. The method of claim 4, wherein:

in a first raycasting stage, each ray is cast from the ego location against the collision surface of the target object only, to determine whether the ray collides with the collision surface of the target object; and in a second raycasting stage, only ray(s) determined to intersect the collision surface of the target object in the first raycasting stage are re-cast, against the collision surface of at least one other of the 3D multi-object simulation, to determine whether each of those ray(s) intersects the collision surface of the at least one other object between the ego location and the collision surface of the target object.

6. The method of claim 5, wherein a maximum distance is imposed on the first raycasting stage, the maximum distance defined by a point of the target object furthest from the ego location, wherein if any ray is extended up to the maximum distance without colliding with the collision surface of the target object, that ray is consequently determined not to intersect the collision surface of the target object.

7. The method of claim 5, wherein:

the occlusion metric is optionally a numerical value indicating a number of occluded rays in proportion to a total number of rays that intersect the collision surface of the target object;

a maximum distance is optionally imposed on the first raycasting stage, the maximum distance defined by a point of the target object furthest from the ego location, wherein if any ray is extended up to the maximum distance without colliding with the collision surface of the target object, that ray is consequently determined not to intersect the collision surface of the target object; and the re-casting of each ray in the second raycasting stage is limited using knowledge of the point at which the ray was determined to intersect the collision surface of the target object in the first raycasting stage, such that the ray is extended in the second raycasting stage no further than a collision distance defined by that known point.

8. The method of claim 1, wherein, for at least one ray of the rays determined to intersect the collision surface of the target object, determining whether the ray is occluded comprises determining whether the ray is truncated in that the ray falls outside of a field of view associated with the ego location.

9. The method of claim 8, wherein:

for at least one of the rays determined to intersect the collision surface of the target object, determining whether the ray is occluded comprises determining whether the ray intersects a collision surface of at least one other object of the 3D body multi-object simulation between the ego location and the collision surface of the target object;

separate occlusion metrics are computed that separately quantify the extent of truncation and the extent of occlusion by other object(s); and a combined occlusion metric is optionally computed that quantifies an overall extent of truncation and occlusion by other object(s).

10. The method of claim 1, comprising outputting the occlusion metric in association with at least one simulated ground truth perception output for the target object.

11. The method of claim 10, wherein the occlusion metric and the at least one simulated ground truth perception output are input to a perception error model, which computes therefrom a realistic perception output having a level of perception error that reflects the extent of occlusion.

12. The method of claim 11, wherein the realistic perception output is provided to an autonomous stack under testing, wherein the ego location of the 3D multi-object simulation is subsequently updated to implement a decision taken by a planner of the autonomous stack in dependence on the realistic perception output.

13. The method of claim 1, wherein the reference surface is located in 3D space based on a location of the target object at a variable distance from the ego location, wherein each reference point of the set of reference points has a fixed density.

14. The method of claim 13, wherein a point on the 3D bounding box closest to the ego location is used to locate the reference surface.

15. The method of claim 1, wherein the reference surface is a reference plane in 3D space.

16. The method of claim 15, wherein the reference plane lies substantially perpendicular to a line of sight between the ego location and the target object.

17. The method of claim 1, wherein the occlusion metric is computed for each of multiple target objects of the 3D multi-object simulation.

18. The method of claim 1, wherein multiple occlusion metrics are computed for the or each target object of the 3D multi-object simulation, based on different fields of view and/or different ego locations.

19. A computer system comprising one or more computers configured to carry out a method of computing an occlusion metric for a target object in a 3D multi-object simulation that represents real-world conditions, the method comprising:

determining, in a reference surface defined in 3D space, a bounding box projection for a target object of a 3D multi-object simulation, wherein the target object is represented in 3D space by a collision surface and a 3D bounding box, and the bounding box projection is determined by projecting the 3D bounding box into the reference surface with respect to an ego location;

using the bounding box projection to determine a set of reference points in 3D space for raycasting within a region of 3D space defined by the ego location and the bounding box projection;

for each reference point of the set of reference points, casting a corresponding ray within said region of 3D space based on the ego location, and determining whether the corresponding ray intersects the collision surface of the target object;

for each ray that is determined to intersect the collision surface of the target object, determining whether the ray is occluded; and computing the occlusion metric, the occlusion metric conveying an extent to which the rays that intersect the collision surface of the target object are occluded;

wherein the occlusion metric is used to determine different levels of error that reflect different possible real-world conditions.

20. A non-transitory media embodying computer-readable instructions configured, upon execution on one or more processors, to perform a method of computing an occlusion metric for a target object in a 3D multi-object simulation that represents real-world conditions, the method comprising:

determining, in a reference surface defined in 3D space, a bounding box projection for a target object of a 3D multi-object simulation, wherein the target object is represented in 3D space by a collision surface and a 3D bounding box, and the bounding box projection is determined by projecting the 3D bounding box into the reference surface with respect to an ego location;

using the bounding box projection to determine a set of reference points in 3D space for raycasting within a region of 3D space defined by the ego location and the bounding box projection;

for each reference point of the set of reference points, casting a corresponding ray within said region of 3D space based on the ego location, and determining whether the corresponding ray intersects the collision surface of the target object;

for each ray that is determined to intersect the collision surface of the target object, determining whether the ray is occluded; and computing the occlusion metric, the occlusion metric conveying an extent to which the rays that intersect the collision surface of the target object are occluded;

wherein the occlusion metric is used to determine different levels of error that reflect different possible real-world conditions.

* * * * *